United States Patent
Yamaji et al.

(10) Patent No.: US 6,755,911 B2
(45) Date of Patent: Jun. 29, 2004

(54) CRUCIBLE MADE OF CARBON FIBER-REINFORCED CARBON COMPOSITE MATERIAL FOR SINGLE CRYSTAL PULLING APPARATUS

(75) Inventors: Masatoshi Yamaji, Mitoyo-gun (JP); Hisanori Nishi, Mitoyo-gun (JP); Yuji Tomita, Mitoyo-gun (JP); Shingo Bito, Kagawa (JP); Toshiyuki Miyatani, Mitoyo-gun (JP)

(73) Assignee: Toyo Tanso Co., Ltd., Osaka (JP)

( * ) Notice: Subject to any disclaimer, the term of this patent is extended or adjusted under 35 U.S.C. 154(b) by 0 days.

(21) Appl. No.: 10/136,531

(22) Filed: May 2, 2002

(65) Prior Publication Data

US 2002/0185061 A1 Dec. 12, 2002

(30) Foreign Application Priority Data

May 2, 2001 (JP) ........................................ 2001-134762

(51) Int. Cl.[7] .............................................. C30R 35/00
(52) U.S. Cl. ........................ 117/200; 117/900; 117/20; 428/34.1; 432/264
(58) Field of Search ................................ 117/200, 900, 117/20; 428/34.1; 432/264

(56) References Cited

U.S. PATENT DOCUMENTS 6,136,094 A * 10/2000 Yamaji et al. ............... 117/200

FOREIGN PATENT DOCUMENTS

| JP | 10101471 A | * | 4/1998 | ........... C30B/15/10 |
| JP | 11255586 A | * | 9/1999 | ........... C30B/15/10 |
| JP | 11255587 A | * | 9/1999 | ........... C30B/15/10 |

OTHER PUBLICATIONS

Patent Abstracts of Japan. English Abstract of JP 11-255586. (1999).*
Patent Abstracts of Japan. English Abstract of JP 11-255587 (1999).*
Patent Abstracts of Japan. English Abstract of JP 10-101471. (1998).*

* cited by examiner

*Primary Examiner*—Nadine G. Norton
*Assistant Examiner*—Matthew Song
(74) *Attorney, Agent, or Firm*—Oblon, Spivak, McClelland, Maier & Neustadt, P.C.

(57) ABSTRACT

A crucible 1 made of a C/C composite material for use in single crystal pulling, the crucible 1 having a lateral cylindrical portion 11 and a bottom portion 12 integrally formed as multiple layers wound by a filament winding method, in which the first layer 2 as the innermost crucible layer, among the multiple layers, is wound such that carbon fibers form tracks passing the polar point O at the bottom 12, the second layer 3 wound on the outer surface of the first layer 2 is wound along tracks to form a first outer circular bottom 8 that extends outwardly from about a middle part of a raised portion 6 where the carbon fibers of the first layer 2 are localized to the polar point O, and the third layer 4 and the succeeding layers wound on the outer surface of the second layer 3 are wound respectively along tracks to form outer circular bottoms that extend stepwise outwardly from about the middle parts of the outer surfaces of layers situated inside the respective layers, and the top for the raised portion of the first layer and the top for each of the outer circular bottoms at the bottom of the carbon fibers wound around as the multiple layers are at an substantially identical height, detachment and deformation of carbon fibers during use being suppressed by reducing the machining for the bottom of the crucible after molding.

3 Claims, 7 Drawing Sheets

CRUCIBLE MADE OF CARBON FIBER-REINFORCED CARBON COMPOSITE MATERIAL FOR SINGLE CRYSTAL PULLING APPARATUS

BACKGROUND OF THE INVENTION

1. Field of the Invention

This invention concerns a crucible made of carbon fiber-reinforced carbon composite material for use in pulling silicon single crystals apparatus by a Czochralski method (hereinafter referred to as a CZ method).

2. Related Art

In the CZ method, silicon single crystals are formed by pulling up molten silicon in crucibles. For the crucibles, those made of quartz having characteristics of high melting point, high temperature stability and less reactivity with molten silicon have been used. FIG. 6 shows a schematic view of a CZ silicon single crystal pulling apparatus. The outline for the CZ method is to be explained with reference to the drawing.

In FIG. 6, a quartz crucible 42 filled with polycrystalline silicon is placed at the inside of a crucible 43 in a chamber 41. The crucible 43 is placed on a susceptor 46 and pivoted on a pedestal 47, and situated centrally of the chamber 41. Further, a heater 44 and a temperature keeping cylinder 45 are disposed so as to surround the outer periphery of the crucible 43 to melt the polycrystalline silicon in the quartz crucible 42 by heating. The temperature for the polycrystalline silicon is directly measured by a pyrometer 48, by which temperature is controlled. Then, a seed crystal 50 attached to a seed chuck 49 is immersed in the molten polycrystalline silicon in the quartz crucible 42, and pulled up under rotation in the direction identical with or opposite to that of the crucible 43 to grow silicon single crystals.

For the production of silicon single crystals by the CZ method, a quartz crucible for melting silicon in the inside and a crucible made of graphite for containing and supporting the quartz crucible from the outside are used. In recent years, since the diameter of the single crystals to be manufactured is increased, the size of the pulling apparatus used in the CZ method is also increased. Correspondingly, the size of the graphite crucible is enlarged and the weight thereof is increased making it difficult for handling. Further, it has also resulted in a problem that the effective processing size in the pulling apparatus is decreased.

Carbon fiber-reinforced carbon composite material (hereinafter referred to as a C/C composite material) is light in weight compared with the graphite material and has excellent characteristics in various kinds of mechanical strengths. Accordingly, the processing chamber of the apparatus can be used effectively. Further, owing to the reduced weight, handlability such as installation to the apparatus is also excellent. In view of the above, the material of furnace components including the crucible used for the single crystal pulling apparatus of a large diameter by the CZ method have now been shifted from graphite to the C/C composite material The method of manufacturing a crucible made of the C/C composite material mainly includes the following two methods.

One of them is a method referred to as a filament winding method. In this method, after immersing a carbon fiber bundle formed by bundling carbon fibers into a binder of low viscosity comprising, for example, a thermosetting resin and a solvent and then winding the carbon fiber bundle deposited with the binder around a mandrel having the shape conforming a crucible thereby forming the same into a required crucible shape. Then, heat setting is conducted, for example, at a temperature of about 100 to 300° C. and the resultant shaped product is carbonized in an inert gas such as $N_2$ gas at a temperature, for example, of about 1000° C. After the carbonization, a phenol resin, tar pitch or the like is impregnated optionally and then heating is applied at a temperature of 1500° C. or higher to conduct carbonization (graphitization). The crucible obtained by steps described above is heated, for example, in a halogen gas atmosphere at a temperature of about 1500 to 2500° C. to apply a high purity treatment and obtain a crucible comprising a C/C composite material.

The other is method referred to as a hand layup method. In this method, carbon fiber cloths are appended to the mold of a crucible to manufacture a molded product and then applied with thermosetting, carbonization, graphitization and high pure treatments to obtain a crucible made of a C/C composite material.

Generally, the C/C composite material is manufactured by combining the filament winding method and the hand layup method.

By the way, when the crucible 43 is actually used, it is necessary that the bottom thereof is flattened such that it can be placed stably on the susceptor 46 (refer to FIG. 6). For this purpose, as shown in FIG. 7, the bottom 52 of a crucible 51 has been flattened by cutting off a hatched portion 53 in FIG. 7 by machining. In this case, carbon fibers at the crucible bottom 52 are cut. Accordingly, this causes deformation of the crucible bottom 52 by the plastic deformation or the like of the C/C composite material per se or detachment of the carbon fibers. Then, when the crucible bottom 52 is deformed, gaps are formed to the C/C composite material crucible 51 themselves and between the C/C composite material crucible 51 and the susceptor 46 (refer to FIG. 6). SiO gases intrude into the gaps upon pulling operation and react with the crucible to form SiC, thereby resulting in a problem of consuming the crucible. Further, the carbon fibers at the cut portion 53 occasionally suffer from defoliation by the stresses upon deformation.

This invention has been accomplished for overcoming the foregoing problems and intends to provide a crucible made of a C/C composite material for use in single crystal pulling apparatus that can decrease the amount of machining as less as possible for the bottom of the crucible after forming the crucible by the filament winding method or the like used for single crystal pulling apparatus and suppress detachment or deformation of carbon fibers during use.

SUMMARY OF THE INVENTION

For overcoming the foregoing problems, this invention provides a crucible made of a C/C composite material for use in single crystal pulling, the crucible having a lateral cylindrical portion and a bottom portion integrally formed as multiple layers wound by a filament winding method, in which the first layer as the innermost crucible layer, among the multiple layers, is wound such that carbon fibers form tracks passing the polar point at the bottom, the second layer wound on the outer surface of the first layer is wound along a track to form a first outer circular bottom that extends outwardly from about a middle part of a raised portion where the carbon fibers of the first layer are localized to the polar point, and the third and the succeeding layers wound on the outer surface of the second layer are wound respectively along tracks to form outer circular bottoms that extend stepwise outwardly from about the middle parts of the outer surfaces of layers situated inside the respective layers, and the top for the raised portion of the first layer and the top for each of the outer circular bottoms at the bottom of the carbon fibers wound around as the multiple layers are at an substantially identical height. Further, the top may be flattened by machining.

According to the crucible made of a C/C composite material of this invention, the bottom of the crucible forms a bottom of a substantially identical height after molding by a filament winding method, which can be placed stably on a susceptor. Further, a flat surface can be formed by machining a portion of the tops for the protrusions on a corrugating surface formed slightly at the bottom to a required minimum extent. Further, when the amount of cutting by machining is restricted to 40% or less, preferably, 30% or less for the thickness of the bottom (thickness for the top of the raised portion of the first layer), the mechanical strength at the bottom is not lowered, detachment or defoliation of the carbon fibers during use is decreased and the deformation of the crucible per se made of the C/C composite material can also be suppressed. This can suppress conversion of the crucible into SiC upon pulling single crystals.

Further, this invention also provides a crucible made of a C/C composite material for single crystal pulling use, the crucible having a lateral cylindrical portion and a bottom portion formed integrally as multiple layers wound by a filament winding method, in which a substantially disk-shaped or a circular cylindrical bottom central member comprising a carbonaceous material is disposed at a central portion of the bottom, the first layer of the carbon fibers as the innermost crucible layer or plural layers including the second layer and the succeeding layers, among the multiple layers, are wound so as to cover the lateral periphery of the bottom central member along the circumferential surface thereof up to the height substantially identical with the bottom of central member, the respective layers after the layer of the carbon fibers wound up to the height substantially identical with the bottom of the bottom central member are would along tracks to form outer circular bottoms that extend stepwise outwardly from the layers situated inside of the respective layers, and the tops for the central bottom member and for each of the outer circular bottoms at the bottom of the carbon fibers wound around as the multiple layers are at an substantially identical height.

As described above, since the bottom central member comprising the carbonaceous material is disposed at the center of the bottom, the stability of the bottom can be improved further. Further, an opening can be formed to the bottom central portion without cutting the crucible-forming carbon fibers.

DETAILED DESCRIPTION OF THE INVENTION

An embodiment of a crucible made of a C/C composite material according to this invention is to be described with reference to the drawings.

Figure 1A:
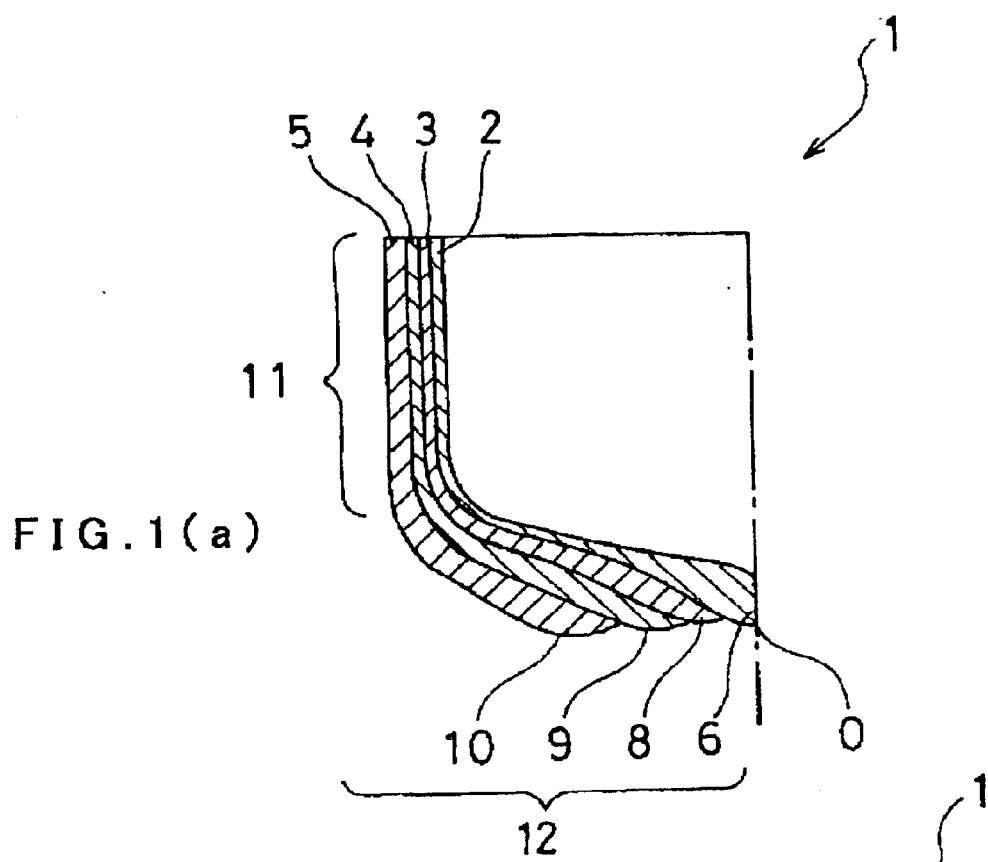
FIG. 1 is a view showing a lateral cross sectional view and a bottom view for one example of an embodiment of a crucible made of a C/C composite material according to this invention.
Figure 1B:
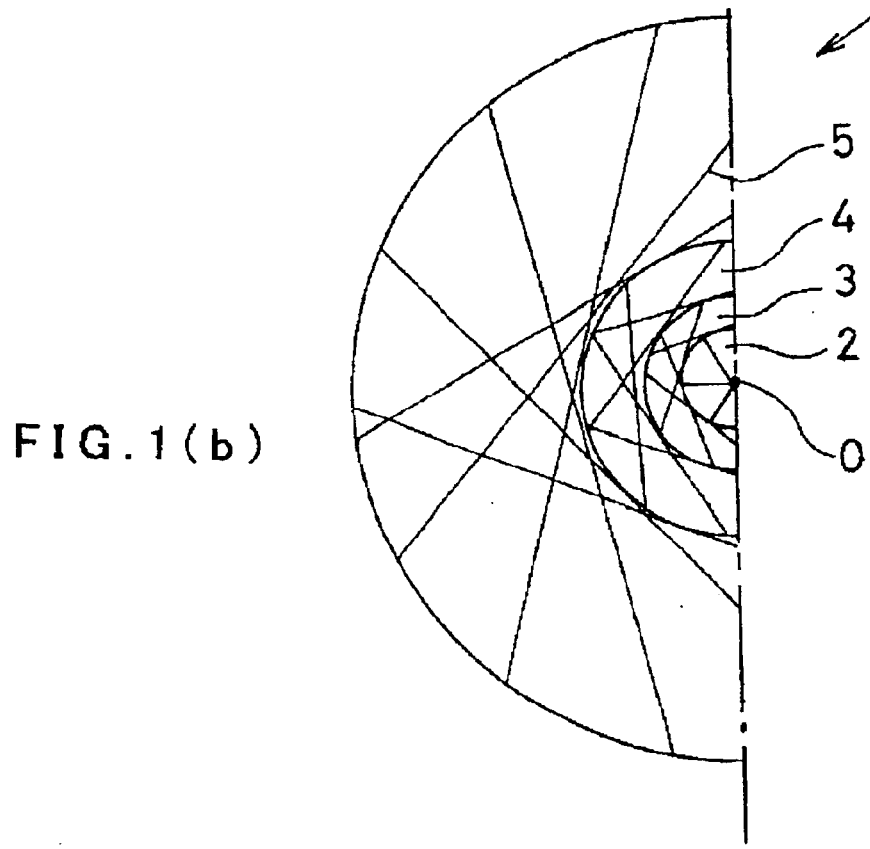

FIG. 1 shows a crucible 1 made of a C/C composite material according to this embodiment in which (a) is a side cross sectional view and (b) is a bottom view. As shown in FIG. 1, the crucible 1 made of the C/C composite material according to this embodiment has a multi-layered structure in which carbon fiber bundles formed by bundling carbon fibers are wound into four layers comprising a first layer 2 as the innermost layer, a second layer 3 formed on the outer surface thereof a third layer 4 formed on the outer surface of the second layer 3, and a fourth layer 5 formed on the outer surface of the third layer 4.

As shown in FIG. 1, the carbon fiber bundles forming the first layer 2 are wound so as to form tracks passing the polar point O at the bottom of the crucible 1 made of the C/C composite material. Accordingly, the carbon fiber bundles overlap at the polar point O to form a part of a raised portion 6.

In the second layer 3, each of the carbon fiber bundles is would while finely controlling the winding angle on the middle part of the raised portion 6 at the polar point O of the first layer 2 so as to be along a circle-forming track, that is, tangential lines of a circle or in the direction parallel therewith. Accordingly, a first outer circular bottom 8 slightly raised by the overlap of each of the carbon fiber bundles is formed at a portion in contact with the first layer 2 so as to extend outwardly from the middle part of the raised portion 6 at the polar point O. Further, the top of the raised portion of the first outer circular bottom 8 and the top part of the raised portion 6 at the polar point O can be made substantially identical with each other by winding while finely controlling the winding angle as described above.

The third layer 4 is formed by winding each of the carbon fiber bundles while finely controlling the winding angle so as to be along circle-forming track at a middle part of the raised portion of the first outer circular bottom 8 that is formed by the second layer 3 on the bottom 12 of the crucible 1 made of the C/C composite material, and a second outer circular bottom 9 is formed so as to extend outwardly from the middle part of the raised portion of the first outer circular part 8. Since the carbon fiber bundles are would around while finely controlling the winding angle also at the top for the raised portion of the second outer circular bottom 9, it is substantially identical at the height with the top for the raised portion 6 at the polar point O and the top for the raised portion of the first outer circular bottom 8.

The fourth layer 5 is wound so as to be along a circle-forming track at a middle part of the raised portion 9 of the second outer circular bottom 9 that is formed by the third layer 4 on the bottom 12 of the crucible 1 made of the C/C composite material. In this case, it is formed by winding each of the carbon fiber bundles while finely controlling the winding angle and the third outer circular bottom 10 is formed so as to extend outwardly from the middle part of the raised portion of the second outer circular bottom 9. Since the carbon fiber bundles are would around while finely controlling the winding angle also for the top of the raised portion of the third outer circular bottom 10, it is substantially identical with the height for the top part of the raised portion 6 at the polar point O, the top for the raised portion of the first outer circular bottom 8 is substantially identical with the top for the raised portion of the second outer circular bottom 9.

As described above, the carbon fiber bundles forming each of the layers are wound along tracks spaced stepwise each at a substantially equal distance circularly from the polar point O of the crucible bottom 12 while finely controlling the winding angle respectively. Accordingly, the heights of the tops for the raised portion 6 and for each of the outer circular bottoms 8, 9 and 10 formed by the respective layers being overlapped to each other at the crucible bottom 12 are made in a substantially identical height. Accordingly, it can be placed in the susceptor and placed on the CZ apparatus in a stable state with no flat machining for the crucible bottom 12 as in the prior art.

Then, a method of manufacturing the crucible 1 made of the C/C composite material according to this embodiment is to be explained.

Figure 2A:
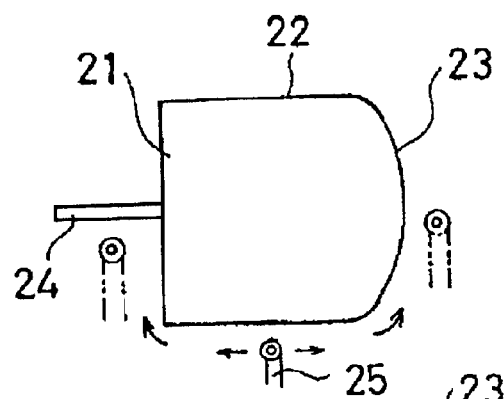
FIG. 2 is a view for explaining a method of manufacturing a crucible made of a C/C composite material of one embodiment according to this invention.
Figure 2C:
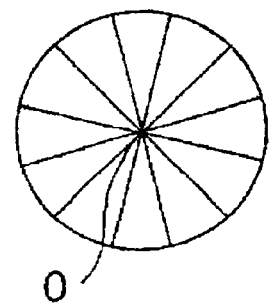

In FIG. 2(a), a mandrel 21 has a cylindrical portion 22, a bulged portion 23 bulging in a bowl-like shape at one end of the cylindrical portion 22 and a shaft 24 protruded from the center at the other end of the cylindrical portion 22. The cylindrical portion 22 has an outer diameter corresponding to the inner diameter of a lateral body portion 11 of the crucible 1 made of the C/C composite material and is made somewhat longer than the lateral body portion 11 of the crucible 1 made of the C/C composite material. The bulged portion 23 has a curved outer surface conforming the curved shape at the inside of the bottom 12 of the crucible 1 made of the C/C composite material. The mandrel 21 is supported by the shaft 24 capable of rotation under control, and a delivery portion 25 for supplying carbon fiber bundles impregnated with a binder as a matrix precursor is moved along the outer circumference of the mandrel 21. This enables filament winding such as polar winding, parallel winding and level winding optionally. In this case, the carbon fiber bundles wound on the side at the other end of the cylindrical portion 22 are to be discarded. Since the carbon fiber bundles may sometimes cause slip at the circumferential portion at the other end, pins may be disposed for preventing the deviation of the carbon fiber bundles.

Then, a step up to the completion of the crucible made of the C/C composite material by using the mandrel 21 is to be explained specifically. Multiple layers of 2D cloths impregnated with a binder as a matrix precursor such as a thermosetting resin are appended (not illustrated) on the surface of the mandrel 21. By the appension of the 2D cloths, the inner surface of the crucible 1 made of the C/C composite material is flattened.

Figure 2B:
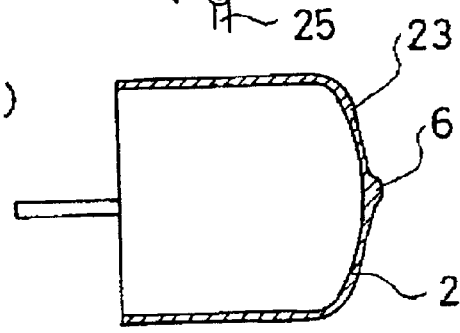

Then, as shown in the side cross sectional view and the bottom view in each of FIGS. 2(b) and (c), carbon fiber bundles are wound in a polar winding so as to be along tracks passing the polar point O at the bulged portion 23 to form the first layer 2, in this step, the raised portion 6 is formed at the polar point O by overlap of the carbon fiber bundles.

Figure 2D:
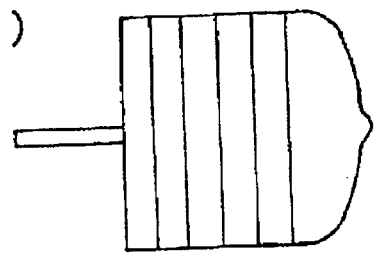
Figure 2F:
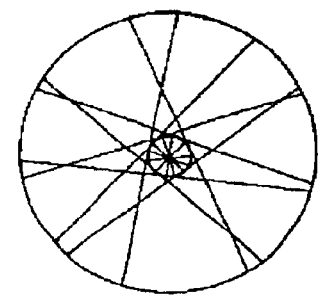

Then, as shown in FIG. 2(d), parallel winding is applied by winding along the circumferential direction of the cylindrical portion 22. This parallel winding is conducted such that the winding angle relative to the central axis is approximate to 90°, which forms the circumferential strengthening layer for the crucible body portion.

Figure 2E:
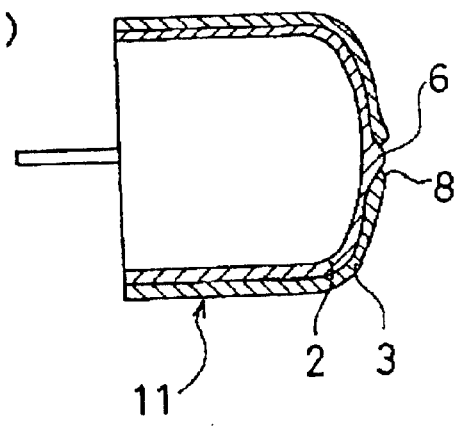

Then, as shown in FIG. 2(e) and (f) the carbon fiber bundles are wound by a level winding while finely controlling the winding angle along tracks so as to form a circle at the middle part of the raised portion 6 of the first layer 2. Thus, a first outer circular bottom 8 is formed to the outer circumference of the raised portion 6 of the first layer 2. Then, parallel winding is applied to the lateral cylindrical portion 11. Subsequently, the tracks of the carbon fiber bundles wound to the bulged portion 23 of the mandrel 21 are changed such that the diameters for the respective outer circular bottoms 8, 9 and 10 extend stepwise outwardly from the middle parts of the raised portion 6 at the polar point O and the respective outer circular bottoms 8, 9 in order to provide optional number of layers and layer thickness. Then, level winding and the parallel winding to the lateral cylindrical portion 11 are repeated to form a multi-layered molded product of the crucible 1 made of the C/C composite material.

After the molding steps as described above, the mandrel 21 wound around with the molded body is dried as it is. Then, heating is applied while providing the molded body at the outer circumference of the mandrel 21 with an external pressure to heat-cure the binder as the matrix precursor such as the resin Then, the molded body is detached from the mandrel 21. Thus, a molded body of a crucible shape is obtained. The molded body is heated and baked to apply carbonization in an inert atmosphere at 800 to 1000° C. Then, the carbonized body is impregnated with pitch or the like and baked at 800 to 1000° C. The steps described above are repeated twice to four times to apply densification. When a predetermined density is obtained, it is heated to 1800 to 2200° C. to conduct graphitization.

Subsequently, a high purity treatment is applied in a halogen gas atmosphere under a reduced pressure of 10 Pa to 50 kPa to obtain a highly pure product with the ash content of 20 ppm or less. Then, a pyrolytic carbon is impregnated to the inside through the pores present at the surface by the CVD method, thereby coating the surface.

The pyrolytic carbon is a graphitized product at high purity and high degree of crystallization obtained by thermally decomposing hydrocarbons, for example, hydrocarbon gases or hydrocarbon compounds of 1 to 8 carbon atoms, particularly, propane having number of carbon atoms of three or a methane gas having a number of carbon atom of 1.

The CVD method referred to herein is a Chemical Vapor Deposition method, which includes a so-called CVI method of impregnating and precipitating the pyrolytic carbon through the open pores to the inside of the substrate. Then, using the hydrocarbons or hydrocarbon compounds described above, the operation is conducted at a hydrocarbon concentration of 3 to 30%, preferably, 5 to 20% and a entire pressure of 13 kPa or less, preferably, 6 kPa or less. When such an operation is conducted, hydrocarbons form macro carbon compounds near the surface of the substrate by way of dehydrogenation, thermal decomposition and polymerization, they are deposited on the substrate and further undergo dehydrogenating reaction to form a dense pyrolytic carbon layer or which are penetrated and impregnated. The temperature for the precipitation is generally within a wide range from 800 to 2500° C. and it is desirable to precipitate the pyrolytic carbon in a relatively low temperature region of 1300° C. or lower in order to impregnate as deeply as possible. Further, in a case of forming the pyrolytic carbon as far as the inside, it is preferred to set the precipitation time to a long period of 50 hours or more, preferably, 100 hours or more. Further, this enable to form the pyrolytic carbon between each of the fibers thoroughly which contributes to the improvement of the inter-layer shearing strength of the C/C composite material. Further, for improving the degree of impregnation, an isothermal method, a temperature gradient method or a pressure gradient method can be used. Alternatively, a pulsative method of enabling to shorten the time and densification may also be used. Subsequently, a dense pyrolytic carbon may sometimes be coated on the surface. The retention time is controlled so as to provide a desired thickness usually at 1500 to 2200° C. while setting other conditions as described above. The impregnation and coating of the pyrolytic carbon by the CVD method are properly adjusted to the working conditions or the like or the treatment by the CVD method is not adopted depending on the working conditions.

Carbon fibers to be used have no particular restriction and any of carbon fibers such as PAN type, rayon type or pitch type may be used. In view of the strength that can be adopted in the filament winding method, PAN type carbon fibers are more preferred. In the case of considering the reaction resistance to Si, use of pitch type fibers is preferred. There is also no particular restriction on the diameter of the carbon fibers and 2 μm or more of diameter is preferred while considering the prevention of disconnection of fibers upon filament winding. The number of filaments in the carbon fiber bundle used is preferably 1000/bundle or more with a view point of preventing fiber disconnection upon filament winding. The number of filaments can be made, for example, as 1000 to 200,000/bundle.

The binder forming the matrix precursor has no particular restriction and organic binders such as thermosetting resins including phenol resins and furan resins, and coal-tar pitch may be used.

The crucible 1 made of the C/C composite material of this embodiment manufactured as described above has the bulk density of 1.4 g/cm$^3$ or more.

Figure 3:
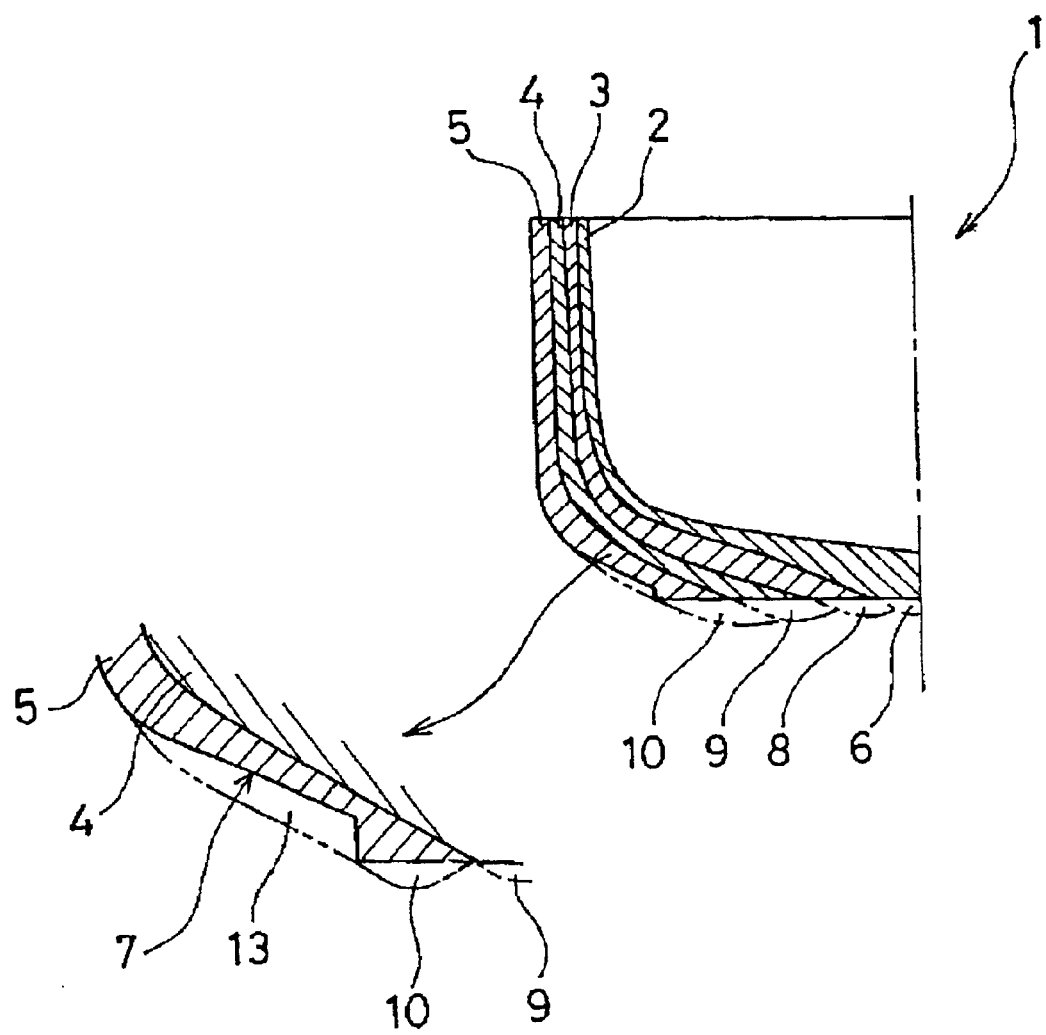
FIG. 3 is a lateral cross sectional view and a fragmentary enlarged view after machining for one example of an embodiment of a crucible made of a C/C composite material according to this invention.
Figure 6:
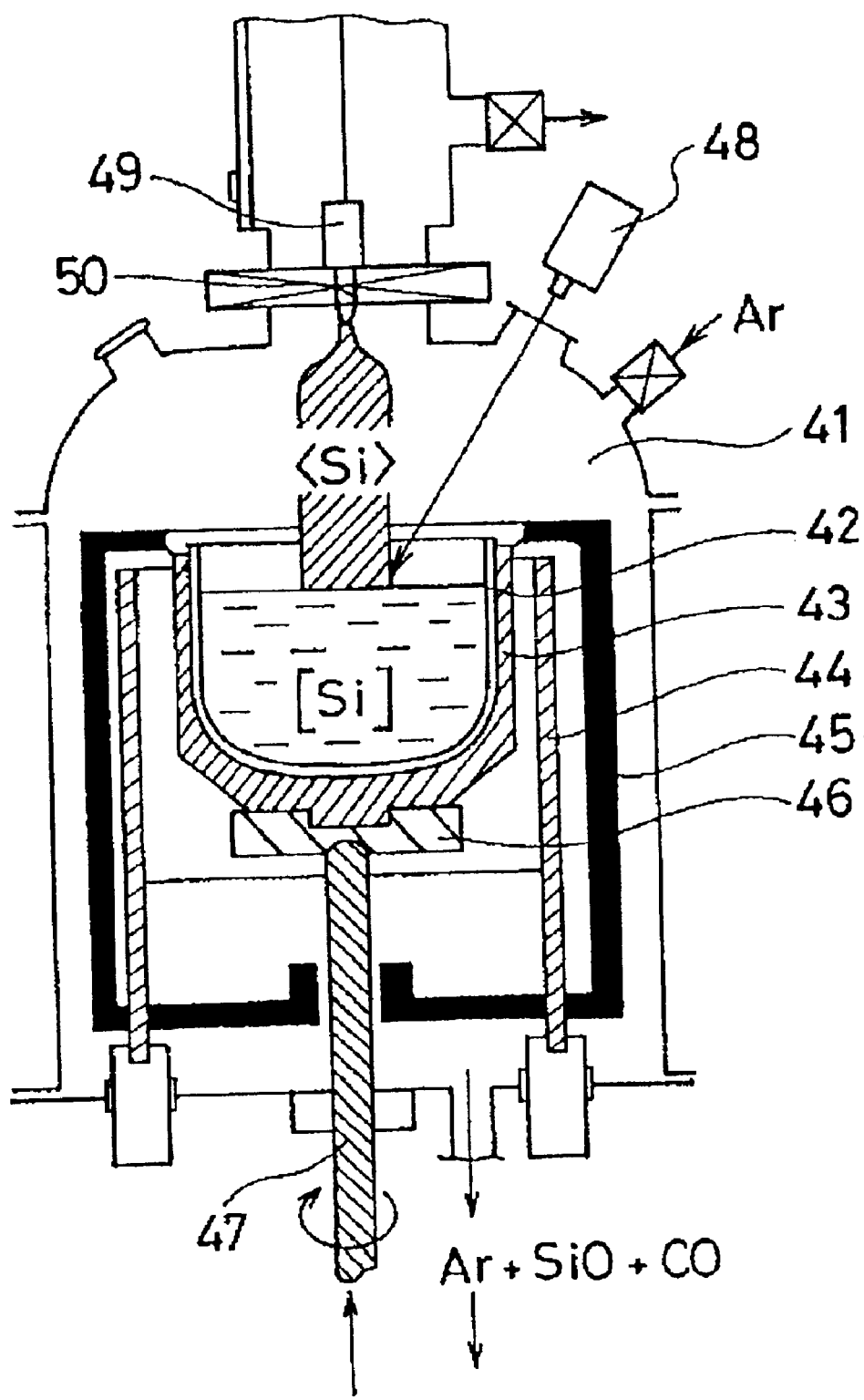
FIG. 6 is a view for explaining a CZ method.
Figure 7:
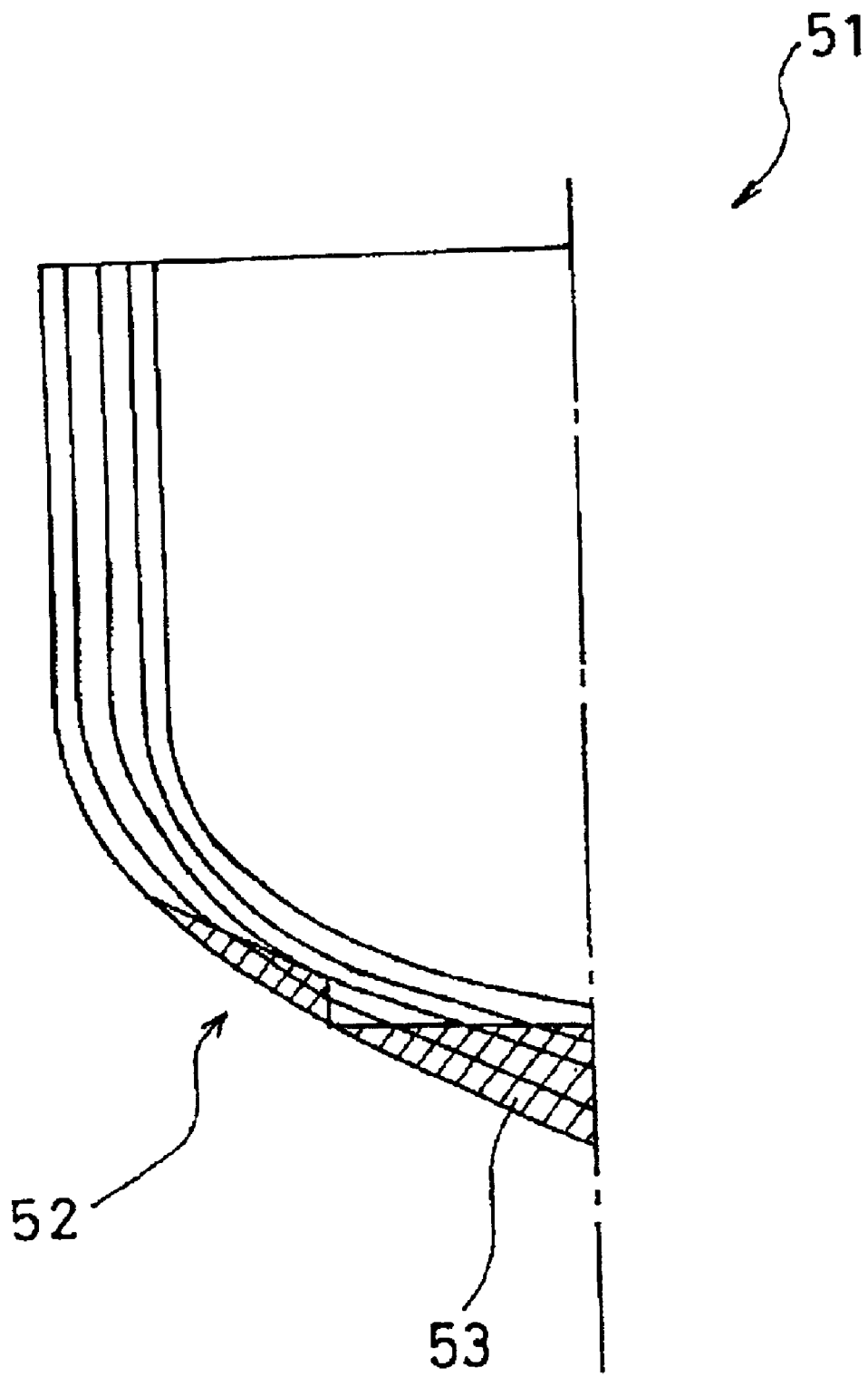
FIG. 7 is a view for explaining the shape of a bottom of an existent crucible made of a C/C composite material.

Further, the bottom of the crucible 1 may be cut off at a portion shown by the dotted chain in FIG. 3 conforming the shape of the susceptor 46 of the CZ apparatus (refer to FIG. 6) such that the crucible 1 can be placed reliably on the susceptor 46. As shown in FIG. 3, only the raised portion 6, tops for respective outer circular bottoms 8, 9 and 10 and an a rounded corner 13 of the fourth layer 5 on the crucible bottom 12 are cut off. Since the height is substantially identical at the tops for the raised portion 6 and each of the circular bottoms 8, 9 and 10 by the way of winding as described above, a flat surface can be formed by cutting off the portion by 40% or less, preferably, 30% or less for the thickness of the crucible bottom 12 (thickness for the raised portion 6). Further, by cutting the rounded corner 13 of the fourth layer 5 into a tapered portion 7, stable location in the CZ apparatus is possible. Further, even when deformation should occur by the stresses upon cooling, contact between the crucible and the heater can be avoided.

As described above, in the C/C composite material crucible according to this invention, the carbon fiber bundles at the bottom are not cut or, in a case of applying machining, less carbon fiber bundles are cut by machining, and detachment of the carbon fibers upon use in the CZ apparatus can be suppressed. Further, since the amount of the machining is small, lowering of the mechanical strength at the bottom of the crucible can also be suppressed and it does not deform even by the thermal stresses exerted repetitively during used in the CZ apparatus. Accordingly, no gaps are formed relative to the susceptor and consumption of the crucible can be suppressed.

Figure 4:
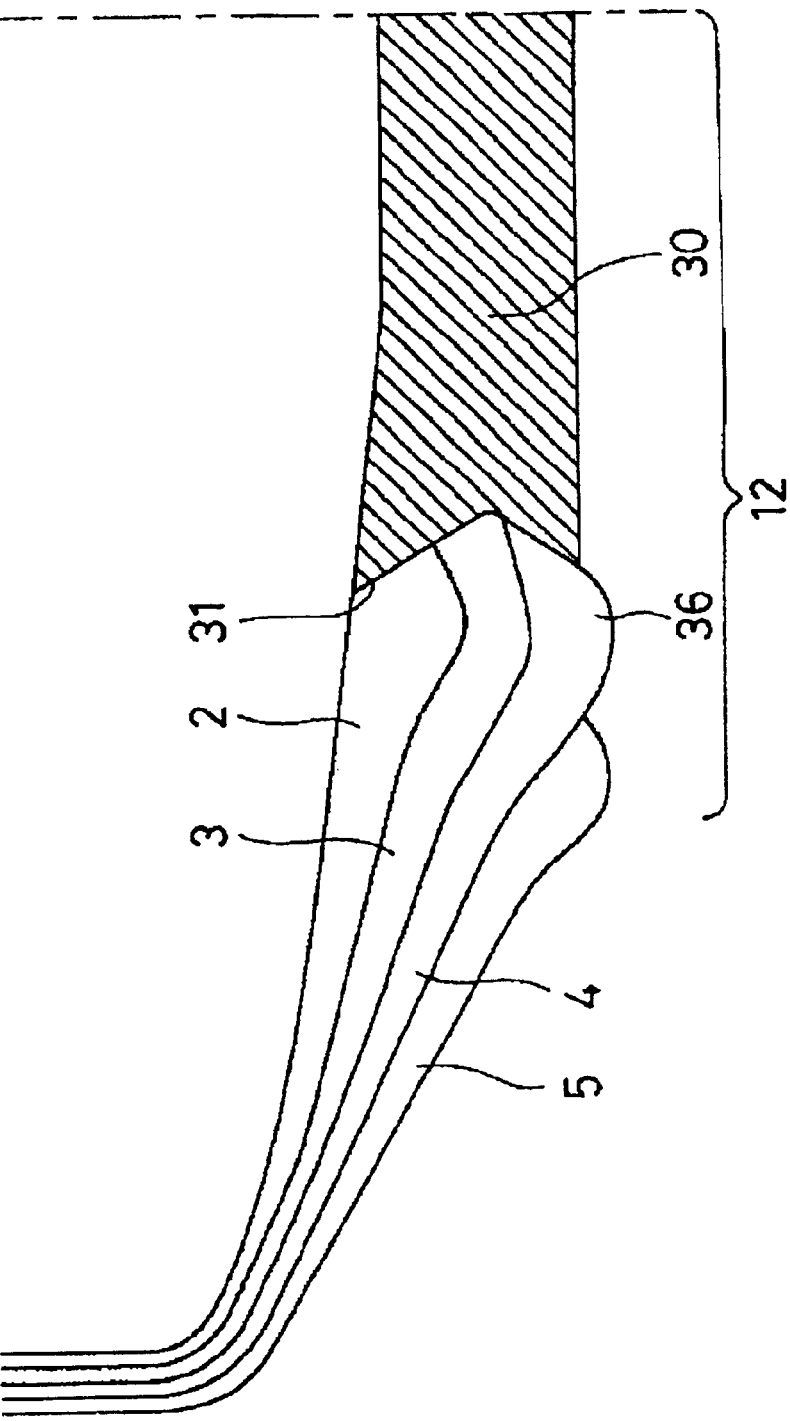
FIG. 4 is a lateral cross sectional view and a bottom view for another example of an embodiment of a crucible made of a C/C composite material according to this invention.

Further, as shown in FIG. 4, in the C/C composite material crucible according to this invention, a substantially disk-like or circular cylindrical bottom central member 30 made of a carbonaceous material can also be disposed at the center of a bottom 12. In this case, for the first layer as the innermost layer of the crucible, the carbon fibers are wound around along a lateral circumferential surface 31 of the bottom central member 30. Then, a second layer 3 wound around the outer surface of the first layer 2 is laminated on the surface of the first layer 2 and wound around along the lateral circumferential surface 31 of the bottom central member 30. Further, a third layer 4 is laminated on the surface of the second layer 3, wound around so as to cover the lateral circumferential surface 31 of the bottom central member 30 and wound around so as to be at a substantially identical height with the bottom of the bottom central member 30 to form a raised portion 36, Then, each of the layers after the third layer 4 is wound along a track forming the outer circular bottom which extends stepwise outwardly from each of the layers that are situated inside of the respective layers. Then, the tops for the raised portions 36 of respective outer circular bottoms are at a substantially identical height. Accordingly, the crucible can be placed stably on the susceptor without machining the tops. In addition, an aperture may be fabricated to the bottom central member 30. Since the aperture is formed to the portion of the bottom central member 30, it is not necessary to cut the carbon fibers that form the crucible 1, which can greatly save the manufacturing cost. Further, provision of the bottom central member 30 enables to decrease the portion of cutting the crucible forming carbon fibers as less as possible. The number of layers of the carbon fibers wound around so as to cover the lateral circumferential surface 31 for the bottom central member 30 are properly adjusted to the working conditions.

Figure 5:
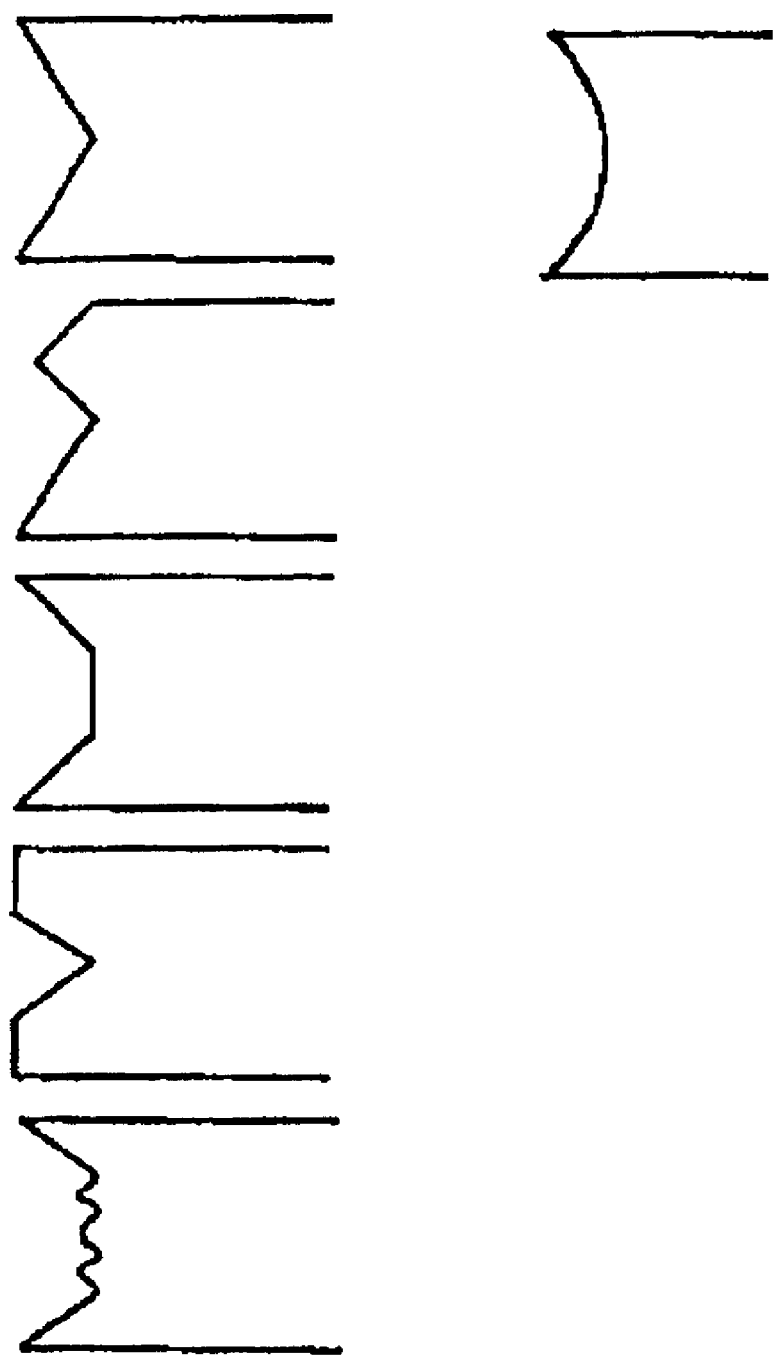
FIG. 5 is a view showing examples of forms for bottom central members used in one embodiment of a crucible made of a C/C composite material according to this invention.

The shape for the bottom central member 30 is not restricted to that shown in FIG. 4 but may be in various shapes as shown in FIG. 5. Further, the shape is not restricted to those shown in FIG. 5 where the lateral circumferential surface is shaped into a concave configuration but it may be formed in a protruded configuration contrary to those shown in FIG. 5.

EXAMPLE 1

Using the mandrel 21 shown in FIG. 2, TOREKA T-300 3K (manufactured by Toray Co.) plain weave cloth impregnated with a phenol resin was appended by three layers to the surface of the mandrel 21, on which filament winding was applied. Filament winding was conducted by polar winding using six filaments of TOREKA T-300 12K (manufactured by Toray Co.) while impregnating a phenol resin and such that they formed tracks passing through the polar point O of the bulged portion 23 of the mandrel 21 and cover the entire surface thoroughly. Then, a parallel winding was applied at a winding angle to the central axis of 85° to 90° to form the first layer 2. Then, a second layer 3 was formed to the outer surface of the first layer 2. In this case, level winding was conducted using six filaments of TOREKA T-300 12K (manufactured by Toray Co.) while impregnating the phenol resin such that they passed through the tracks to define 60 mm of the inner diameter for the first outer circular bottom 8. Then, parallel winding was applied with a winding angle relative to the central axis of 85° to 90° to form the second layer 3. Level winding was applied to the outer surface of the second layer 3 using six filaments of TOREKA T-300 12K (manufactured by Toray Co.) while impregnating a phenol resin such that they passed through the tracks to define 100 mm of the inner diameter for the second outer circular bottom 9. Then, parallel winding was conducted at a winding angle of 85° to 90° relative to the central axis to form the third layer 4. Level winding was conducted to the outer surface of the third layer 4 using six filaments of TOREKA T-300 12K (manufactured by Toray Co.) while impregnating the phenol resin such that they passed through the tracks define 140 mm inner diameter for the third outer circular bottom 10. Then, parallel winding was applied at a winding angle relative to the central axis of 85° to 90° to form a fourth layer 5, thereby forming a molded product with the thickness of 2 mm for each of the layers for the lateral cylindrical portion 11, the outer diameter of 470 mm and the thickness of the bottom 12 of 20 mm. Then, the molded product was heat cured in the oven. After thermosetting, it was detached from the mandrel 21 to obtain a crucible shape molded product. Then, the temperature was elevated to 1000° C. to obtain a C/C composite material. Further, pitch impregnation and baking were repeated twice to conduct densification. In addition, as the final heat treatment, it was heated under a reduced pressure to 2000° C. to apply graphitization.

The molded product obtained by way of the steps described above was machined at the bottom 12 as shown in FIG. 3. In this case, only the dotted chain portion shown in the figure, that is, only the tops for the raised portion 6 and for each of the outer circular bottoms 8, 9 and 10 were machined. The cutting amount by machining was 5% for the thickness of the crucible bottom 12. After machining, a high purity treatment was further applied in a halogen gas atmosphere under a reduced pressure at 2000° C. Subsequently, impregnation and coating treatments with pyrolytic carbon were applied by a CVD method to obtain a final product. The bulk density of the crucible 1 made of the C/C composite material was increased to 1.58 g/cm³ by the CVD treatment. The thus obtained crucible 1 made of the C/C composite material was placed in a CZ apparatus and a test for pulling single crystals in an actual apparatus was conducted.

EXAMPLE 2

A crucible was manufactured in the same manner as in Example 1 except for setting the cutting amount by machining for the crucible bottom 12 to 30% for the thickness of the crucible bottom 12 to obtain a crucible made of a C/C composite material, which was placed in the CZ apparatus and a test for pulling up single crystals in an actual apparatus was conducted in the same manner as in Example 1.

EXAMPLE 3

A crucible was manufactured in the same manner as in Example 1 except for setting the cutting amount by machining for the crucible bottom 12 to 40% for the thickness of the crucible bottom 12 to obtain a crucible made of a C/C composite material, which was placed in the CZ apparatus and a test for pulling single crystals in an actual apparatus was conducted in the same manner as in Example 1.

COMPARATIVE EXAMPLE 1

Using the mandrel 21 shown in FIG. 2, TOREKA T-300 3K (manufactured by Toray Co.) plain weave cloth impregnated with a phenol resin was appended by three layers to the surface of the mandrel 21, on which filament winding was applied. Filament winding was conducted using six filaments of TOREKA T-300 12K (manufactured by Toray Co.) while impregnating a phenol resin by polar winding and parallel winding with the winding angle at 85° to 90° relative to the central axis, alternately, as shown in FIG. 5, repetitively, to the same thickness as in Example 1. The body portion had a mixed layer by parallel winding and polar winding but the bottom was formed only by polar winding. Then, the molded product was heat cured in an oven. After heat curing, the molded product was detached from the mandrel 21 to obtain a molded product of a crucible-shape. Then, temperature was elevated up to 1000° C. to obtain a C/C composite material. Further, densification was conducted by twice repeating the pitch impregnation and baking. In addition, it was heated under a reduced pressure at 2000° C. as the final heat treatment to conduct graphitization. Then, machining was conducted so as to obtain the same shape as that in Example 1. In this case, the cutting amount by machining was 50% for the thickness of the crucible bottom 12. Subsequently, a high purity treatment and a CVD treatment were conducted in the same manner as in Example 1 to form a crucible made of a C/C composite material, which was located in the CZ apparatus and a test of pulling single crystals in an actual apparatus was conducted.

COMPARATIVE EXAMPLE 2

A crucible was manufactured in the same manner as in Example 1 except for changing the cutting amount by machining for the crucible bottom 12 to 45% for the thickness of the crucible bottom 12 to form a crucible made of a C/C composite material, which was located in the CZ apparatus and a test for pulling up single crystals in an actual apparatus was conducted in the same manner as in Example 1 to Example 3, and Comparative Example 1.

Table 1 shows the result for the test in the actual apparatus in Example 1 to Example 3 and Comparative Example 1 and Comparative Example 2, collectively.

TABLE 1

| | State of crucible after use for 30 times | Remarks | Amount of cutting* % |
|---|---|---|---|
| Example 1 | No abnormality | No abnormality after use for 100 times | 5 |
| Example 2 | No abnormality | Bottom deformed slightly after use for 100 times | 30 |
| Example 3 | No abnormality | Bottom deformed slightly after use for 50 times | 40 |
| Comp. Example 1 | Deformed at the bottom | Gap formed between crucible and receiving tray | 50 |
| Comp. Example 2 | Deformed at the bottom | Gap formed between crucible and receiving tray | 45 |

*The amount of cutting shows the ratio assuming the thickness at the crucible bottom being as 1

As shown in Table 1, in the crucible of Example 1, deformation of the crucible and detachment of the carbon fibers were not observed even after conducting the pulling treatment for 100 times. Further, in the crucible of Example 2, the crucible bottom deformed somewhat after conducting the pulling up treatment for 100 times. Further, in the crucible of Example 3, the crucible bottom deformed somewhat after conducting pulling up treatment for 50 times. On the other hand, in the crucible of Comparative Example 1, the crucible bottom deformed somewhat, and gaps were formed between the crucible and the receiving tray after the pulling up treatment for 30 times. Further, in the crucible of Comparative Example 2, the crucible bottom deformed somewhat, and gaps were formed between the crucible and susceptor after pulling up treatment for 30 times in the same manner as in Comparative Example 1.

As has been described above, according to this invention, the height can be made substantially identical for the raised portion at the polar point and the tops for each of the outer circular bottoms formed by each of the layers, by extending the tracks along which the carbon fiber bundles are wound in the polar winding by the filament winding method stepwise substantially in proportion. Therefore, in the machining for flattening the crucible bottom, the cutting amount can be reduced to 40% or less and it is possible to prevent lowering by machining of the mechanical strength at the crucible bottom. Accordingly, when the crucible is used in the CZ apparatus, it is free from deformation by thermal stresses exerting repetitively and a crucible made of the C/C composite material of long endurance life can be obtained.

What is claimed is:

1. A crucible for a single crystal pulling process, comprising:

a carbon fiber reinforced carbon composite material having a lateral cylindrical portion and a bottom portion integrally formed as multiple layers wound by a filament winding method, the multiple layers including a first layer, a second layer, a third layer and at least one succeeding layer, the first layer forming the innermost crucible layer which is wound such that carbon fibers form tracks passing the polar point at the bottom, the second layer being wound on the outer surface of the first layer along a track to form a first outer circular bottom that extends outwardly from about a middle part of a raised portion where the carbon fibers of the first layer are localized to the polar point, and the third and the at least one succeeding layers being wound on the outer surface of the second layer respectively along tracks to form outer circular bottoms that extend stepwise outwardly from about the middle parts of the outer surfaces of layers situated inside the respective layers, the top for the raised portion of the first layer and the top for each of the outer circular bottoms at the bottom of the carbon fibers wound around as the multiple layers being at an substantially identical height.

2. A crucible as defined in claim 1, wherein the top is flattened by machining.

3. A crucible for a single crystal pulling process, comprising:

a circular bottom member having one of a circular cylinder shape and a disk shape, and comprising a carbonaceous material; and a carbon fiber reinforced carbon composite material having a lateral cylindrical portion and a bottom portion formed integrally as multiple layers wound by a filament winding method, the circular bottom member preformed by the carbonaceous material being disposed at a central portion of the bottom, the multiple layers including a first layer, a second layer, and at least one succeeding layer, the first layer being the innermost crucible layer or plural layers including the second and the at least one succeeding layers being wound so as to cover the lateral periphery of the circular bottom member along the circumferential surface thereof up to the height substantially identical with the bottom of the circular bottom member, the respective layers after the layer of the carbon fibers wound up to the height substantially identical with the bottom of the circular bottom member wound along tracks to form outer circular bottoms that extend stepwise outwardly from the layers situated inside of the respective layers, the tops for the circular bottom member and for each of the outer circular bottoms at the bottom of the carbon fibers wound around as the multiple layers being at an substantially identical height.

* * * * *